United States Patent

Ruff et al.

[11] Patent Number: 6,066,864
[45] Date of Patent: May 23, 2000

[54] THYRISTOR WITH INTEGRATED DU/DT PROTECTION

[75] Inventors: Martin Ruff, Vaterstetten; Hans-Joachim Schulze, Ottobrunn; Frank Pfirsch, München, all of Germany

[73] Assignee: Siemens Aktiengesellschaft, Munich, Germany

[21] Appl. No.: 09/194,178
[22] PCT Filed: May 7, 1997
[86] PCT No.: PCT/DE97/00927
§ 371 Date: Nov. 20, 1998
§ 102(e) Date: Nov. 20, 1998
[87] PCT Pub. No.: WO97/44827
PCT Pub. Date: Nov. 27, 1997

[30] Foreign Application Priority Data

May 20, 1996 [DE] Germany ............ 196 20 184
Dec. 6, 1996 [DE] Germany ............ 196 50 763

[51] Int. Cl.[7] .................................................. H01L 29/74
[52] U.S. Cl. .............. 257/175; 257/157; 257/158; 257/166; 257/115
[58] Field of Search ....................... 257/115, 154, 257/157–158, 163–164, 166, 175–176; 438/133, 139–140

[56] References Cited

U.S. PATENT DOCUMENTS

| 4,908,687 | 3/1990 | Temple | 257/115 |
| 5,204,273 | 4/1993 | Kuhnert et al. | 438/140 |

FOREIGN PATENT DOCUMENTS

| 0 062 100 | 10/1982 | European Pat. Off. . |
| 0 219 995 | 4/1987 | European Pat. Off. . |
| 0 572 826 A1 | 12/1993 | European Pat. Off. . |
| 0 637 848 A1 | 8/1995 | European Pat. Off. . |
| 77 00471/2 377 095 | 10/1977 | France . |
| WO86/00469 | 1/1986 | WIPO . |

OTHER PUBLICATIONS

European Patent Office, Patent Abstracts of Japan, Publication No. 59220970, Publication Date Dec. 12, 1984.
European Patent Office, Patent Abstracts of Japan, Publication No. 07122728, Publication Date Dec. 5, 1995.
Thyristor Design and Realization, John Wiley & Sons, Paul D. Taylor, pp. 151–153 (1987).
IEEE Transactions on Electron Devices, vol. Ed 30, No. 7, Jul. 1983, "Controlled Turn–On Thyristors", Victor A.K. Temple.

*Primary Examiner*—John Guay
*Attorney, Agent, or Firm*—Hill & Simpson

[57] ABSTRACT

Given too great a dU/dt load of a thyristor, this can trigger in uncontrolled fashion in the region of the cathode surface. Since the plasma only propagates poorly there and the current density consequently reaches critical values very quickly, there is the risk of destruction of the thyristor due to local overheating. The proposed thyristor has a centrally placed BOD structure and a plurality of auxiliary thyristors (1.–5. AG) annularly surrounding the BOD structure. The resistance of the cathode-side base (8) is locally increased under the emitter region (11) allocated to the innermost auxiliary thyristor (1. AG). Since the width (L) and the sheet resistivity of this annular zone (15) critically influences the dU/dt loadability of the first auxiliary thyristor (1. AG), a suitable dimensioning of these parameters assures that the central thyristor region comprises the smallest dU/dt sensitivity of the system and, accordingly, it also ignites first given upward transgression of a critical value of the voltage steepness.

7 Claims, 3 Drawing Sheets

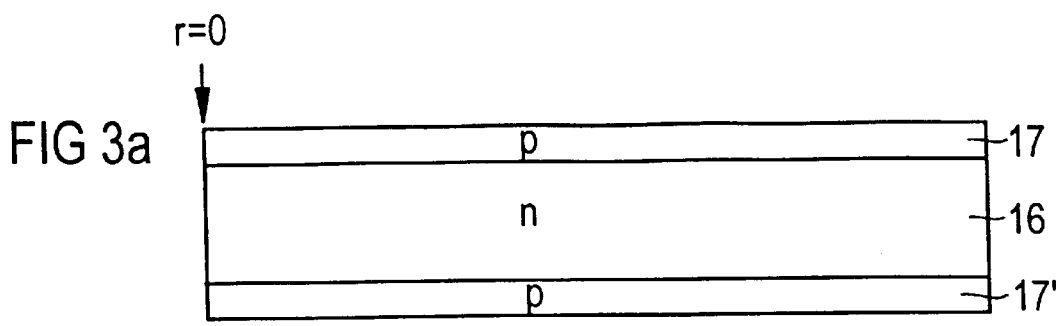
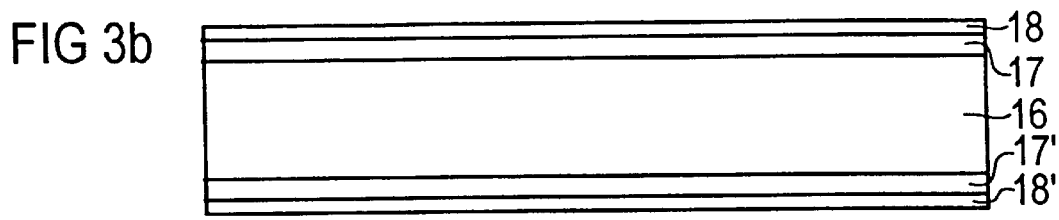
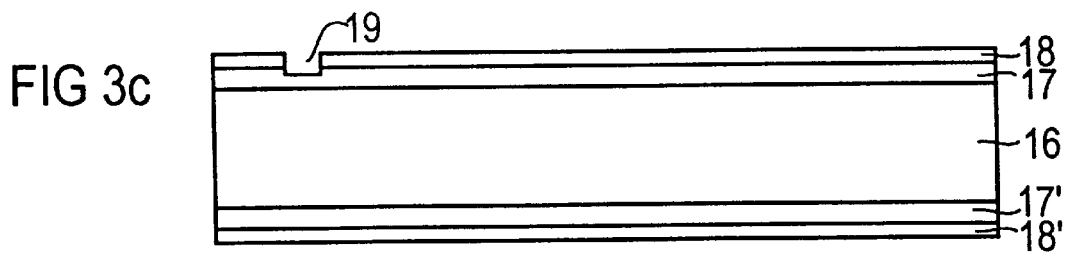
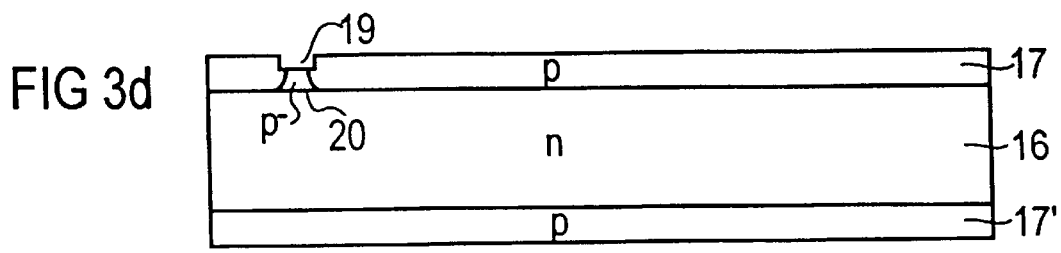

THYRISTOR WITH INTEGRATED DU/DT PROTECTION

BACKGROUND OF THE INVENTION

1. Field of the Invention

The present invention relates generally to a thyristor and specifically to a light-triggerable power thyristor.

A thyristor already ignites before the static trigger voltage $U_{BO}$ is reached when the time change dU/dt of the voltage U applied between its terminals exceeds a specific maximum value for the respective thyristor. This misignition that may lead to the destruction of the thyristor under certain circumstances is caused by the build-up of the space-charge zone at the p-base/n-base junction and the shift current $I_d=C_d \, dU/dt$ ($C_d$: voltage-dependent space charge capacitance of the pn-junction) resulting therefrom that intensifies the blocking current. The dU/dt strength of a thyristor can be substantially improved with the assistance of cathode-emitter shorts, since a majority of the capacitative shift current $I_d$ in the semiconductor body no longer flows over the pn-junction of the cathode side but directly from the base to the cathode. The critical value of the voltage steepness of correspondingly constructed thyristors typically amounts to several 1000 V/µs.

2. Description of Related Art

Power thyristors must be provided with emitter shorts in order to meet the demands with respect to the dU/dt loadability. Emitter shorts, however, divert a part of the gate current directly to the cathode, which has a disadvantageous effect on the trigger sensitivity of the thyristor. Among the things proposed for solving this problem is to optimize the structure of the gate, to compensate the change in potential of the base of the cathode side caused by the capacitative current $I_d$ and to increase the optical trigger sensitivity of the thyristor with a plurality of "amplifying gate" stages connected following one another (see, for example, the reference to Paul D. Taylor, "Thyristor Design and Realization", John Wiley & Sons (1987), pp. 133–141, and the reference IEEE Transactions on Electron Devices, Vol. ED-30, No. 7, July 1983, pp. 816–824.

SUMMARY OF THE INVENTION

The subject matter os the invention is, in particular, a light-triggerable and BOD-(break-over diode) protected thyristor with integrated dU/dt protection. The thyristor should be constructed such that, given a high dU/dt load in trigger direction, it does not ignite in uncontrolled fashion in the region of the cathode surface or of the edge termination. A thyristor with the features recited in patent claim 1 has this property. The dependent claims are directed to advantageous developments and improvements of the thyristor.

Dependent on the type of ignition (electrical or optical drive, dU/dt triggering), the trigger behavior of a thyristor is decisively influenced by the sheet resistivity of the base of the cathode side. The invention utilizes this property in order to displace the trigger event caused by too high a dU/dt load into the central region of the thyristor. Since the volume affected by the triggering always lies within the region limited by the first auxiliary thyristor, the plasma—as in the case of a controlled ignition—can propagate large-area and uniformly in radial direction without having the current density reach critical values.

BRIEF DESCRIPTION OF THE DRAWINGS

The invention is explained below with reference to the drawing. Show are:

FIGS. 3a, 3b, 3c, and 3d, are side sectional views of the semiconductor body of the thyristor after implementation of some steps of the method for manufacturing an annular zone of increased resistance in the base of the cathode side.

DETAILED DESCRIPTION OF THE PREFERRED EMBODIMENT

Figure 1:
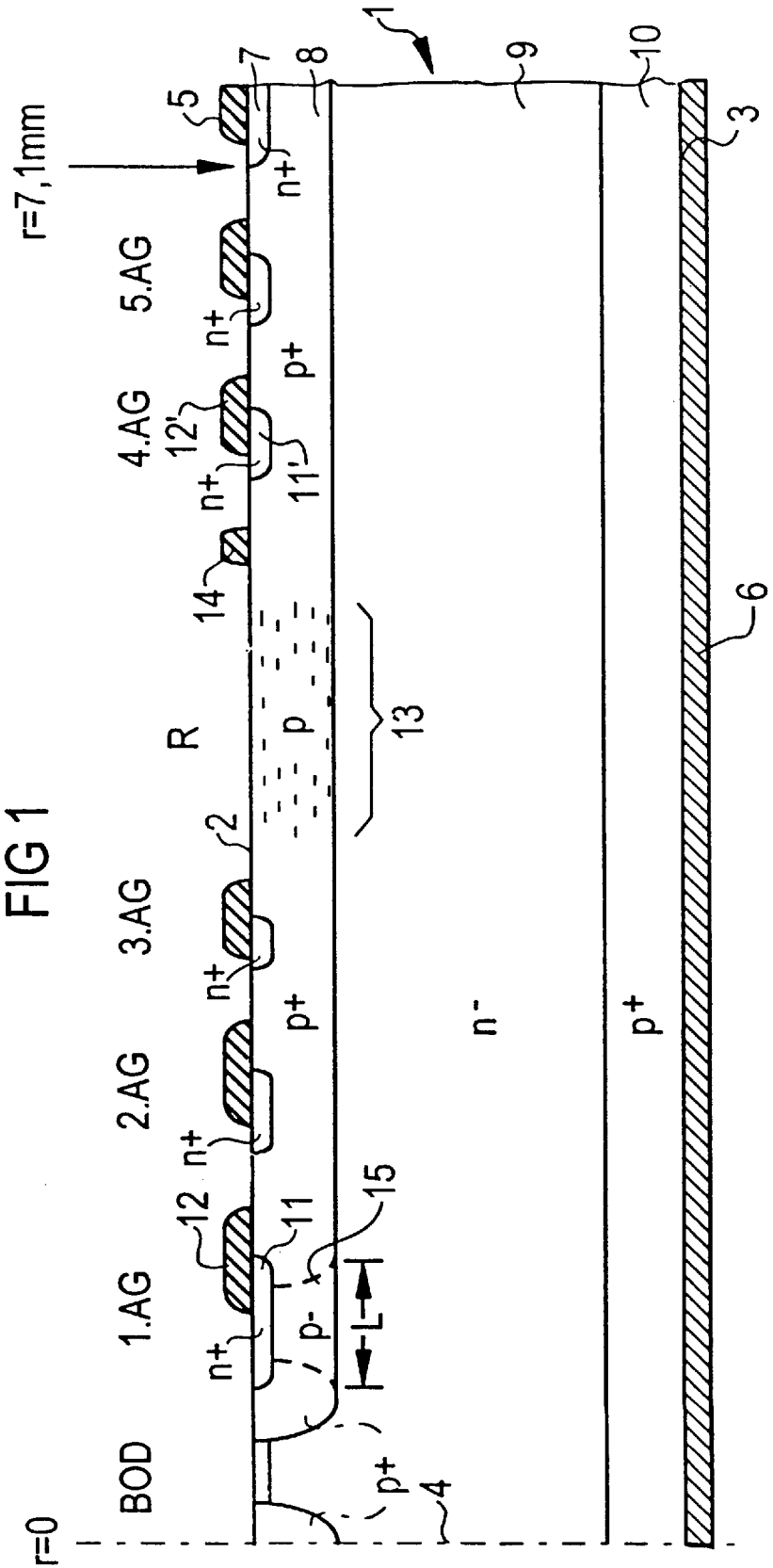
FIG. 1 shows the ignition structure of a BOD-protected, light-triggerable thyristor in crossection.

The light-triggerable thyristor that is shown in crossection in FIG. 1 and is equipped with a BOD (Breakover diode) structure has a rotationally balanced structure with respect to the axis 4 residing perpendicular on the two principal faces ⅔ of the semiconductor body 1. Whereas the upper principal face 2 of the wafer-shaped semiconductor body 1 carries the cathode metallization 5 proceeding at the edge side and provided with what are referred to as emitter shorts, the backside principal face 3 thereof is completely coated with a metallization 6 serving as an anode. The semiconductor body 1 composed of silicon comprises a plurality of differently doped regions 7–10 respectively separated from one another by space charge zones. The regions of different conductivity form the $n^+$-doped cathode-side emitter 7, the p-doped base 8, the only weakly electron-conducting anode-side base 9 as well as the $p^+$-emitter 10 of the thyristor contacted by the anode metallization 6.

The auxiliary thyristors—referenced AG (amplifying gate)—arranged radially within the cathode metallization 5 serve as driver stages for the main thyristor. They respectively comprise an $n^+$-doped auxiliary emitter 11/11' embedded in the cathode-side base 8 and a metallization 12/12' contacting both the auxiliary emitter 11/11' as well as the base 8. The metallization 12/12' extending over the $n^+$ doped region 11/11' has the function of a short-circuit emitter that effectively suppresses an undesired triggering of the respective auxiliary thyristor given great voltage steepnesses dU/dt.

The dopant concentration in a zone 13 of the cathode-side base 8 annularly surrounding the inner three auxiliary thyristors (1–3, AG) is reduced compared to the laterally adjoining regions. This annular zone 13 acts as a resistor R that limits the ignition current flowing radially outward in the base 8 to a predetermined maximum value and thus reduces the load of the structure during the turn-on event (see, for example, the reference IEEE Transactions on Electron Devices, Vol. ED-30, No. 7, July 1983, pp. 816–824 or U.S. Pat. No. 5,204,273. The electrons injected into the cathode-side base 8 from the adjoining auxiliary emitter 11' can recombine at the metal ring 14, so that the resistor R is not subject to any modulation when the thyristor through-connects.

Figure 2:
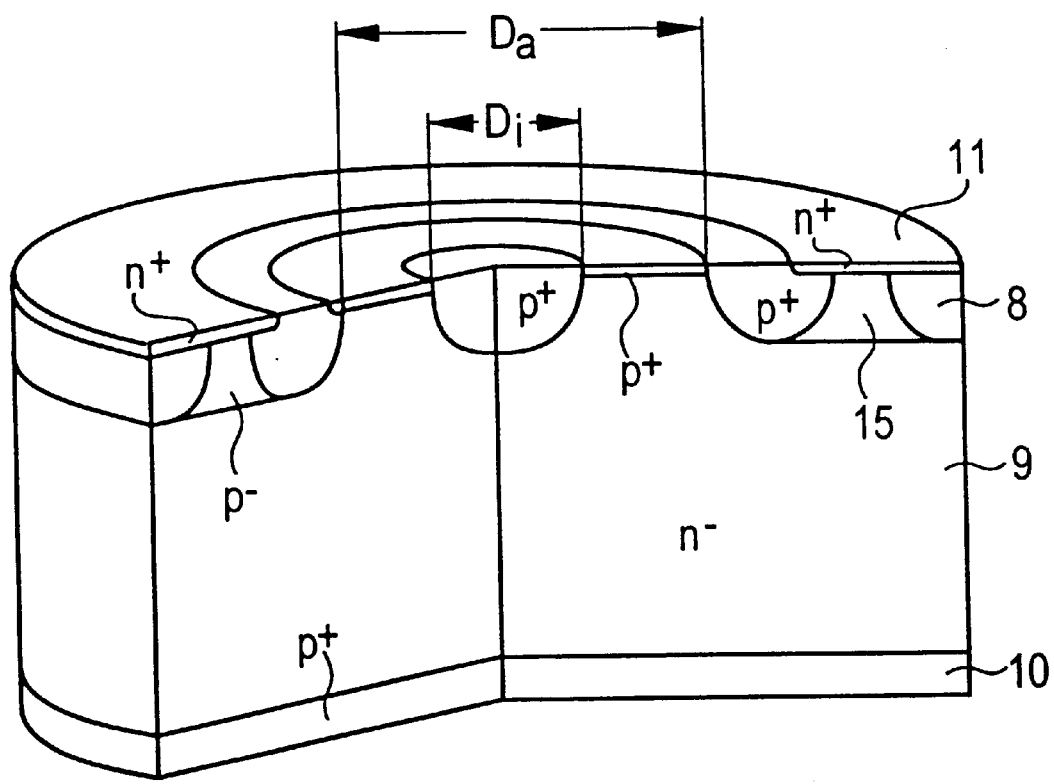
FIG. 2 is a partially cut away perspective view which shows the BOD structure of the thyristor in crossection.

The BOD structure present in the center of the thyristor that is shown enlarged in FIG. 2 and is described in greater detail in the European Patent document EP-0 572 826 A1 serves for over-voltage protection. At $D_i$=350 µm and $D_a$=550 µm, its lateral dimensions are dimensioned such that the breakdown voltage at room temperature T=23° C. amounts to approximately $U_{BOD}\approx 7.7$ kV.

In order to intentionally displace a trigger event caused by too great a dU/dt load into the central region of the thyristor, the cathode-side base 8 has an increased resistance in an annular zone 15 lying under the $n^+$-doped region 11 of the first auxiliary thyristor 1.AG. Since the width L and the sheet resistivity $R_\square$ of the annular zone 15 established by the dopant concentration critically influence both the minimum radiant intensity required for the ignition of the first auxiliary thyristor as well as the dU/dt loadability thereof, the suitable dimensioning of these parameters assures that the centrally placed thyristor structure exhibits the greatest dU/dt sensitivity of the system and, accordingly, triggers first when a critical value of the voltage steepness is exceeded. The sheet resistivity $R_\square$ of the approximately 200–600 $\mu$m wide annular zone 15 typically amounts to $R_\square \approx 2000$–$4000 \, \Omega_\square$. It is thus greater by factor 10–20 than the sheet resistivity of the adjoining base region ($R_\square(p^+ \square 200$–$400 \, \Omega_\square)$.

The point of departure for the manufacture of the annular zone 15 of increased resistance in the cathode-side base 8 is the silicon wafer (n-conductive) shown in FIG. 3a that comprises two aluminum-doped and, thus, p-conductive regions 17/17'. Both its sides are provided in a vacuum with an Al occupation 18/18' that extends to a depth of only about 5 $\mu$m but is comparatively highly doped. This process, which lasts approximately 2 hours, occurs at a temperature T=1060° C. Subsequently, the upper Al occupation 18 is removed region of the later resistance zone in the, whereby a photolithographically structured mask defines the position and width of the etched-out trench 19. The drive-in of the as yet remaining Al occupations 18/18' into the layers 17, 17' lying therebelow ensues at a temperature T=1240° C. During this procedure, which lasts about 20 hours, an annular zone 20 of reduced dopant concentration forms under the trench 19. In a departure from this method, of course, it is also possible to generate the annular zone 20 of increased resistance with a masked boron implantation.

The invention, of course, is not limited to the above-described exemplary embodiment. Without further ado, thus, it is possible to also provide the disclosed dU/dt protection in a thyristor equipped with a conventional gate electrode or a thyristor that does not comprise a BOD structure or, respectively, to generate the zone of increased resistance under some other centrally placed auxiliary thyristor.

Although other modifications and changes may be suggested by those skilled in the art, it is the intention of the inventors to embody within the patent warranted hereon all changes and modifications as reasonably and properly come within the scope of their contribution to the art.

We claim:

1. A thyristor, comprising:
   a) a semiconductor body having
      a cathode-side emitter of a first conductivity type,
      a cathode-side base of a second conductivity type,
      an anode-side base of the first conductivity type and
      an anode-side emitter of the second conductivity type
         following one another in said semiconductor body;
   b) a cathode metallization applied on the cathode-side emitter an anode metallization applied on the anode-side emitter,
   c) an auxiliary emitter embedded in the cathode-side base and formed by an annular region of the first conductivity type that is arranged such that the cathode-side emitter lies outside a region enclosed by the auxiliary emitter,
   d) a metallization contacting the auxiliary emitter and the cathode-side base, and
   e) an annular zone that is arranged between the auxiliary emitter and the anode-side base and that is formed by an annular region in the cathode-side base in which a concentration of doping is reduced compared to laterally adjoining regions of the cathode-side base.

2. A thyristor according to claim 1, wherein concentrations of the dopant are such that the electrical sheet resistivity in the annular zone is greater by a factor 5 through 20 than the electrical sheet resistivity of the laterally adjoining regions of the cathode-side base.

3. A thyristor according to claim 1, wherein
   the annular zone has a width of 200 $\mu$m through 600 $\mu$m.

4. A thyristor according to claim 1, further comprising:
   a break-over diode structure integrated in a central region of the semiconductor body surrounded by the annular zone.

5. A thyristor according to claim 4, wherein said break-over diode structure is formed by
   the auxiliary emitter,
   the annular zone,
   an annular region adjoining the annular zone toward a center in a layer of the cathode-side base that is highly doped for the second conductivity type,
   a further annular region of less thickness adjoining said annular region toward the center that is highly doped for the second conductivity type and that adjoins the anode-side base, and
   a central region adjoining said further annular region and adjoining the anode-side base and highly doped for the second conductivity type that has about the thickness of the cathode-side base.

6. A thyristor according to claim 1, further comprising:
   a plurality of concentrically arranged annular auxiliary thyristors, and
   the annular zone being localized under an innermost auxiliary emitter.

7. A thyristor according to claim 6, further comprising:
   a further annular zone of increased electrical resistance in the cathode-side base localized between two of said auxiliary thyristors.

* * * * *